(12) United States Patent
Uchiyama

(10) Patent No.: US 6,476,461 B2
(45) Date of Patent: Nov. 5, 2002

(54) ARRANGEMENT OF STACKED, SPHERICALLY-SHAPED SEMICONDUCTORS

(75) Inventor: Kenji Uchiyama, Nagano-ken (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/489,985

(22) Filed: Jan. 21, 2000

(65) Prior Publication Data

US 2002/0105056 A1 Aug. 8, 2002

(30) Foreign Application Priority Data

Jan. 25, 1999 (JP) .......................................... 11-015557

(51) Int. Cl.$^7$ .............................................. H01L 29/06
(52) U.S. Cl. ........................ 257/618; 257/531; 257/532; 257/536
(58) Field of Search .................................. 257/618, 627, 257/531, 532, 536; 438/382, 393, 396, 900

(56) References Cited

U.S. PATENT DOCUMENTS

| | | |
|---|---|---|
| 4,451,968 A | 6/1984 | Jensen et al. |
| 5,877,943 A | 3/1999 | Ramamurthi |
| 5,945,725 A | 8/1999 | Ishikawa |
| 5,955,776 A | 9/1999 | Ishikawa |
| 6,031,284 A | 2/2000 | Song |
| 6,046,910 A | 4/2000 | Ghaem et al. |
| 6,052,517 A  * | 4/2000 | Matsunaga et al. ..... 395/500.09 |
| 6,188,127 B1 | 2/2001 | Senba |
| 6,204,545 B1 | 3/2001 | Nakata |

FOREIGN PATENT DOCUMENTS

| | | | |
|---|---|---|---|
| JP | 03083697 | * 4/1991 | ............ B42D/1/10 |
| JP | 11-354661 | * 12/1999 | ........... H01L/23/04 |

OTHER PUBLICATIONS

Ball Semiconductor Co., Ltd., Nikkei Micro Device (No. 157), pp 84–85, Jul. 1, 1998.

* cited by examiner

Primary Examiner—Steven Loke
Assistant Examiner—Ori Nadav

(57) ABSTRACT

To provide a semiconductor device in which a plurality of spherical members are easily stacked at predetermined positions, with at least one of the spherical members being formed of a semiconductor material and having a semiconductor element or wiring formed on the surface of the spherical semiconductor material. One spherical member 11 is placed in a depression formed by three spherical semiconductors 11 that are substantially in contact. The spherical members 11 are stacked in three dimensions so that four spherical members 11 form a triangular pyramid to thereby form a semiconductor device 1. In the stacked spherical semiconductors 11, there may be provided a connecting spherical semiconductor 11E, which only performs the function of electrically connecting the spherical semiconductors 11, and a dummy spherical member 11F, which only performs the function of filling a gap between other spherical members.

20 Claims, 3 Drawing Sheets

ARRANGEMENT OF STACKED, SPHERICALLY-SHAPED SEMICONDUCTORS

BACKGROUND OF THE INVENTION

1. Field of the Invention

The present invention relates to a semiconductor device using a plurality of spherical members, such as spherically shaped semiconductors. More particularly, the present invention relates to a stacking structure of the spherically shaped semiconductors.

2. Description of the Related Art

Conventionally, in manufacturing a semiconductor device, various semiconductor elements have been formed on the surface of a wafer-like semiconductor substrate. In contrast, Ball Semiconductor, Co., Ltd. has disclosed a technology for manufacturing a semiconductor device with the use of a spherical semiconductor having semiconductor elements formed on the surface of a spherical semiconductor material (silicon) in "Nikkei Micro Device (No. 157)", issued on Jul. 1, 1998, and in U.S. Pat. Nos. 5,877,943 and 5,955,776. The spherical semiconductor with semiconductor elements formed thereon may constitute a spherical integrated circuit (IC), for example. Since the spherical semiconductor has a higher area-to-volume ratio compared to the wafer-like semiconductor substrate, it has the advantage that a wider surface area can be achieved with less semiconductor material. Here, the spherical semiconductor material can be obtained by, for example, melting a granular polycrystalline semiconductor material having a diameter of about 1 mm in an argon atmosphere at 1000° C. to 10000° C. using inductively coupled plasma, and by mono-crystallizing the molten material.

In addition, in order to form various semiconductor elements on the surface of the spherical semiconductor material, for example, an exposure method shown in FIG. 5 is used. According to this exposure method, light passing through a mask is reflected by mirrors 31, 32, and 33, which are disposed to encircle a spherical semiconductor material 10, toward the spherical semiconductor material 10, hereby the surface of the spherical semiconductor material 10 is subjected to full plate exposure. In addition, in an etching step or a film deposition step, etching or film deposition is performed by allowing an etching gas or raw material gas and the spherical semiconductor material 10 to flow through a tube.

In addition, the spherical semiconductor having various semiconductor elements formed on the spherical semiconductor material 10 in this way may be used to form a semiconductor device by combining a number of spherical semiconductors 11, stacked on a substrate 15 in multiple stages, as shown in FIG. 6, for example. According to this semiconductor device, spherical semiconductors 11 are stacked directly above other spherical semiconductors 11 aligned on a lower stage, and each of the spherical semiconductors 11 is electrically connected to the vertically and horizontally positioned spherical semiconductors 11 to perform a predetermined operation. Here, a semiconductor element having a predetermined function is formed on each of the spherical semiconductors 11, and each of the spherical semiconductors 11 performs a function such as that of a microprocessor, an input-output interface, a counter, logic, a RAM, or a ROM, for example.

The semiconductor device using such spherical semiconductors 11 will be mounted on various devices in the future, but many problems are yet to be solved. For example, when the semiconductors 11 are used, since they are spherical in shape, they are not easily positioned even if stacked in multiple stages, as shown in FIG. 6.

OBJECTS OF THE INVENTION

Therefore, it is an object of the present invention to overcome the aforementioned problems.

In consideration of the above problem, it is an object of the present invention to provide a semiconductor device in which it is easy to stack at predetermined positions a plurality of spherical semiconductors, each having semiconductor elements or wiring formed on the surface of a spherical semiconductor material.

SUMMARY OF THE INVENTION

Accordingly, the present invention provides a semiconductor device in which a plurality of spherical members are easily stacked at predetermined positions. To this end, the semiconductor device comprises four spherical members, at least one of the spherical members comprises a spherically shaped semiconductor material and a semiconductor element formed thereon. In addition, one of the spherical members is in contact with the other three spherical members.

Specifically, there is provided a semiconductor device including a plurality of spherical members stacked in multiple stages. At least one of the plurality of spherical members is formed of a semiconductor material and includes a semiconductor element or wiring formed on a surface of the semiconductor material. The plurality of spherical members includes at least one set of four spherical members arranged such that a regular triangular pyramid is formed by imaginary lines connecting the centers of said four spherical members. The four spherical members includes three spherical members- aligned so as to be substantially in contact with one another in a lower stage of the multiple stages and one spherical member is stacked, in an upper stage of the multiple stages, on the three spherical members.

According to the present invention, one of the spherical members, stacked on the upper stage, is positioned by the other three spherical members, on the lower stage by, in contrast with the conventional technology, utilizing the fact that the members are spherical in shape. Preferably, three spherical members of four spherical members are arranged so as to be in contact or substantially in contact with one another, and one spherical semiconductor is stacked in a depression that is formed in the center of the three spherical semiconductors. This positioning provides great stability for a structure stacking the four spherical members in three dimensions, and the three spherical members on the lower stage position the spherical member on the upper stage. Therefore, a plurality of spherical members can be stacked at predetermined positions easily. To stack these four spherical members efficiency, or to stack a plurality of sets of spherical members, preferably, each of the spherical members has substantially same size and the members are in contact or substantially in contact with each other.

Here, in the case of stacking more than four spherical members, a plurality of sets of four spherical members may be included such that the imaginary lines connecting the centers of each set of four spherical members form a regular triangular pyramid.

In another aspect of the present invention, a semiconductor device comprises a set of spherical members including four spherical members. The set has at least a first spherical member comprising a spherically shaped semiconductor material and a semiconductor element formed thereon. Also, one of the spherical members is in contact with the other three spherical members so as to be supported thereby. The set of spherical members also has at least one spherical member without a semiconductor element formed thereon, referred to herein as a connecting spherical member.

In an embodiment of the present invention, at least one connecting spherical member formed without a semiconductor element is used to increase the possible combinations for electrically connecting the spherical semiconductors stacked in three dimensions. In this case, a wiring pattern is preferably formed on the connecting spherical member. Therefore, a connecting spherical member performs the function of electrically connecting a plurality of other spherical members.

In another aspect of the present invention, in the plurality of spherical members, a dummy spherical member may be included that performs the function of filling gaps when stacking in multiple stages spherical semiconductors that each have a semiconductor element formed thereon. A semiconductor element is not formed on the dummy spherical member. With this configuration, since the dummy spherical member fills a void even where a spherical semiconductor 11 does not have to exist from the viewpoint of an electrical connection, no gap is formed. Therefore, at any place where the spherical members are stacked, a structure is realized such that one spherical member is stacked in a depression that is formed in the center of three spherical members aligned so as to be in contact or substantially in contact with one another.

Other objects and attainments together with a fuller understanding of the invention will become apparent and appreciated by referring to the following description and claims taken in conjunction with the accompanying drawings.

DESCRIPTION OF THE PREFERRED EMBODIMENTS

A semiconductor device of the present invention will be described with reference to the drawings.

(Overall Configuration of Semiconductor Device)

Figure 1:
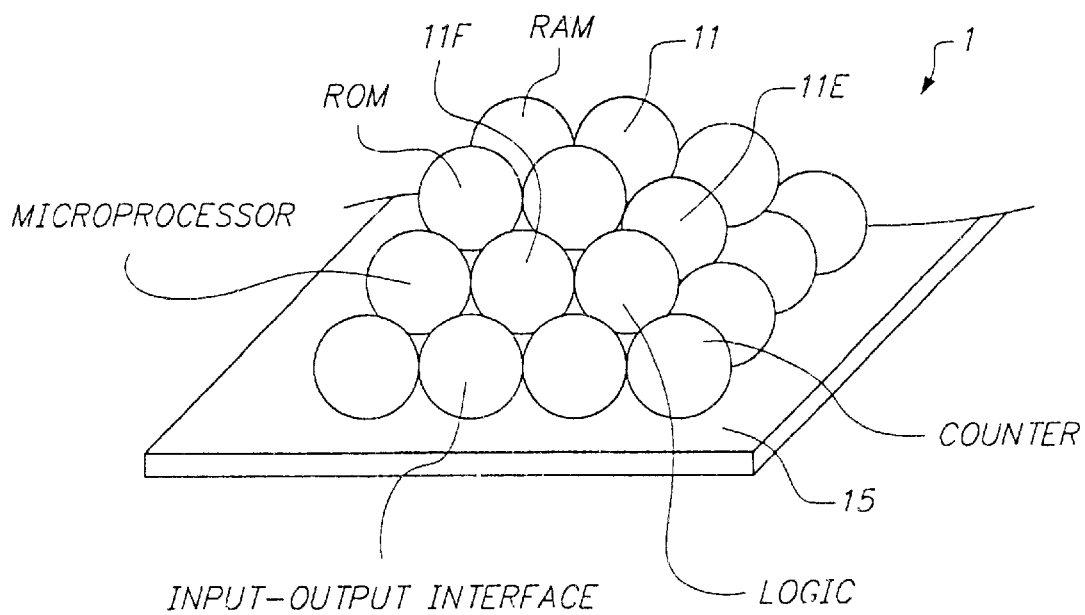
FIG. 1 illustrates schematically a stacking structure of spherical members in a semiconductor device of the present invention.

With reference to FIG. 1, device 1 is formed of a number of spherical members 11. Typically these members 11 will be made of a semiconductor material and will be referred to herein as spherical semiconductors. However, certain of members 11, such as member 11F to be described later, can be made of plastic or glass or other non-conducting material, or at least be formed of a non-conducting material on its outer surface where it will contact other spherical members.

Figure 2:
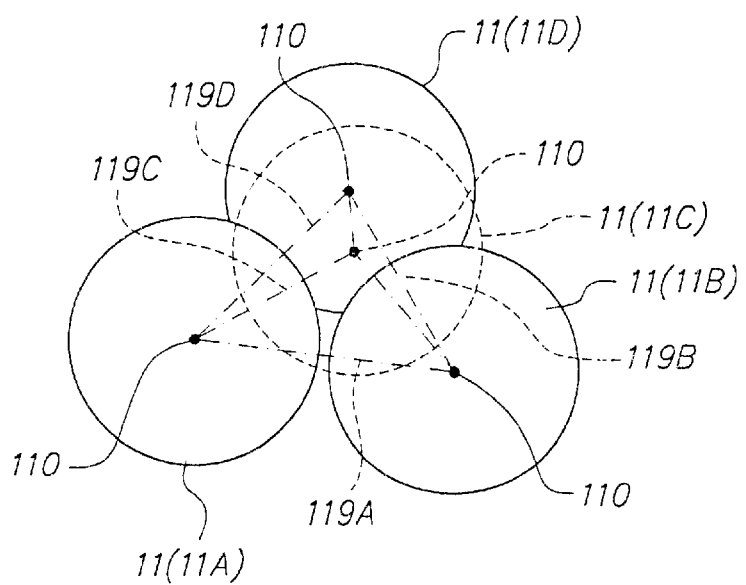
FIG. 2 illustrates four spherical members extracted from the semiconductor device and that are the base unit of the stacking structure shown in FIG. 1.

FIG. 1 schematically shows a stacking structure of spherical semiconductors in a semiconductor device of the present invention, and FIG. 2 shows four spherical semiconductors extracted from the semiconductor device shown in FIG. 1. These four spherical semiconductors form the base unit of the stacking structure.

Referring to FIG. 1, the semiconductor device 1 is formed of a number of spherical semiconductors 11. Individual semiconductors 11 are manufactured with known methods and a detailed description is not necessary for an understanding of the present invention. However, the novel stacking structure of a plurality of the spherical semiconductors 11 in the present invention will be described.

A number of spherical semiconductors 11 are stacked on a substrate 15 in multiple stages to constitute the semiconductor device 1 in this embodiment. The spherical semiconductors 11 on an upper stage are not stacked directly above the spherical semiconductors 11 aligned on the lower stage. Instead, they are stacked so that, in a set of four spherical semiconductors 11 (11A, 11B, 11C, and 11D), imaginary lines 119A, 119B, 119C, and 119D connecting respective centers of the spherical semiconductors form a regular triangular pyramid, as shown in FIG. 2. That is, the structure is such that one spherical semiconductor 11 (11D) is stacked in a depression that is formed in the center of three spherical semiconductors 11 10 (11A, 11B and 11C) arranged so as to be substantially in contact, or nearly in contact with one another. As will be understood from FIG. 1, such a combination forms a basic block for stacking a number of spherical semiconductors 11. For this reason, multiple sets of the combination shown in FIG. 2 exist in the plurality of spherical semiconductors 11 constituting the semiconductor device 1 of this embodiment.

In the thus-constructed semiconductor device 1, individual ones of the spherical semiconductors 11 may perform the function of, for example, a microprocessor, an input-output interface, a counter, logic, a RAM, or a ROM, etc., as shown in FIG. 1. In such spherical semiconductors 11, though they are not shown, contact pads for connecting a spherical semiconductor with other spherical semiconductors or substrate 15, a wiring pattern connected with contact pads, and semiconductor elements such as switching devices including transistors and/or diodes, etc., memory cells, etc., are formed on a surface of the semiconductor material forming the spherical semiconductor.

In this embodiment, a connecting spherical semiconductor 11E, which only performs the function of electrically connecting the spherical semiconductors 11, is also included in the spherical semiconductors 11 stacked in multiple stages. Contact pads for connecting the spherical semiconductor 11E with other spherical semiconductors or substrate 15, and a wiring pattern connected with the contact pads are formed on the spherical semiconductor 11E. However, a semiconductor element, such as a transistor or a memory cell is not formed.

In addition, the plurality of spherical semiconductors 11 includes one or more dummy spherical members 11F which only perform the function of filling gaps when stacking the spherical semiconductors 11 in multiple stages with the structure described with reference to FIG. 2. The spherical member 11F, which may or may not be formed of a semiconductor material, serves only to fill the clearances when stacking the spherical semiconductors 11 in multiple stages, and a semiconductor element, a wiring pattern, and the like are not formed thereon. The dummy spherical semiconductor 11F is preferably, but not necessarily, mechanically connected or coupled to the adjacent spherical semiconductors 11 by a non-conductive or conductive material, such as solder, or a non-conductive or conductive adhesive agent, as described hereinbelow. A dummy terminal and the like for forming the solder or the adhesive agent are formed on the spherical member 11F. The spherical member 11F is preferably formed of a non-conducting or insulating material such as glass or plastic.

In this way, according to the semiconductor device 1 of this embodiment, the spherical semiconductors 11 stacked on the upper stage are automatically positioned by the spherical semiconductors 11 on the lower stage by, in contrast with the conventional technology, taking advantage of the fact that the semiconductors 11 constituting the semiconductor device 1 are spherical in shape. That is, the structure is such that, one spherical semiconductor 11 (11D) is stacked in a depression that is formed in the center of the three spherical semiconductors 11 (11A, 11B and 11C) of the four spherical semiconductors 11 shown in FIG. 2. Such a structure is the most stable one for stacking the four spherical semiconductors 11 in three dimensions. In addition, the three spherical semiconductors 11 (11A, 11B, and 11C) on the lower stage are uniformly in contact with the spherical semiconductor 11 (11D) on the upper stage, whereby the spherical semiconductor 11 (11D) is automatically positioned by the three spherical semiconductors 11 (11A, 11B, and 11C). Therefore, a plurality of spherical semiconductors 11 can be easily stacked at predetermined positions.

In addition, according to this embodiment, since the spherical semiconductors 11 are stacked in three dimensions using the connecting spherical semiconductor 11E, the versatility of the structure is increased in that the possible combinations for electrically connecting the spherical semiconductors 11 is high.

Further, since the dummy spherical semiconductor 11F fills a space where the spherical semiconductor 11 does not have to exist from the viewpoint of an electrical connection, the space does not form a gap. Therefore, at any place where the spherical semiconductors 11 constituting the semiconductor device 1 are stacked, a structure is achieved such that one spherical semiconductor 11 is stacked in a depression that is formed in the center of three spherical semiconductors 11 aligned so as to be in contact or nearly in contact with one another.

(Mounting Structure of Spherical Semiconductors 11)

In the thus-constructed semiconductor device 1, the spherical semiconductors 11 are, for example, electrically connected as follows. FIG. 3 shows the process steps in a method for electrically and mechanically connecting the spherical semiconductors 11.

Figure 3A:
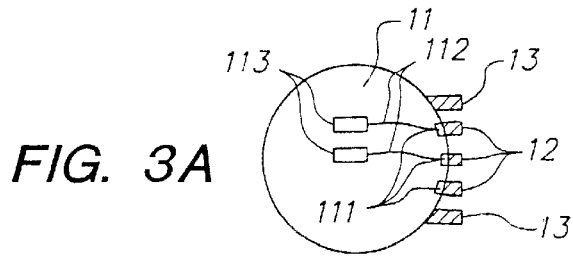
FIGS. 3(A) to 3(C) illustrate the process for electrically and mechanically connecting spherical members to one another in manufacturing a semiconductor device of the present invention.

In this embodiment, as shown in FIG. 3A, solder 12 (conductive material) is first plated on the surfaces of terminals or contact pads 111 of the spherical semiconductor 11. The contact pads 11 are typically connected to wiring 112 which is in turn connected to semiconductor elements 113 as shown in FIG. 3A. However, in the case of dummy spherical member 11F, no wiring or semiconductor elements are provided. Next, instant adhesive agents 13 are applied at areas on the surface of the spherical semiconductor 11 slightly separated from the areas where the contact pads 111 are formed.

Figure 3B:
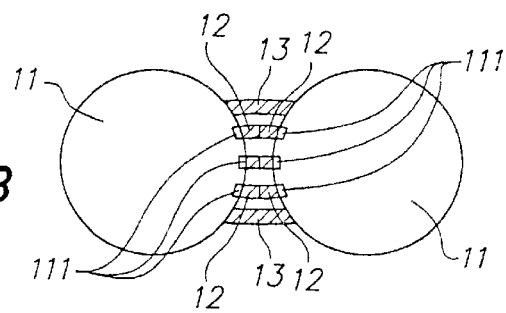

Next, as shown in FIG. 3B, two spherical semiconductors 11 onto which the solder 12 is plated and the instant adhesive agents 13 are applied are butted together so that the instant adhesive agents 13 overlap each other and the solder 12 on each semiconductor overlap therebetween, and the spherical semiconductors 11 are temporarily fixed to each other by the instant adhesive agents 13 (temporary fixing step).

Figure 3C:
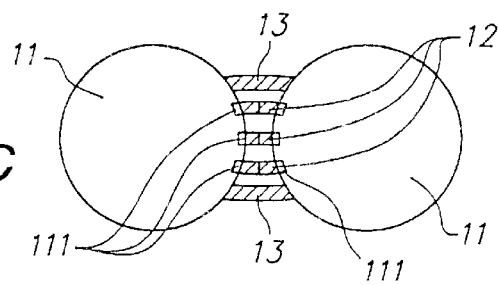

Next, the two spherical semiconductors 11, temporarily fixed by the instant adhesive agents 13, are put in a reflow oven, and are heated to a temperature at which the solder 12 melts. Consequently, as shown in FIG. 3C, the solder 12 on each semiconductor melts into each other between the two spherical semiconductors 11. When taken out of the reflow oven, the two spherical semiconductors 11 are completely fixed by the solder 12. That is, the two spherical semiconductors 11 are electrically and mechanically connected by the solder 12 through one heating step (actual fixing step).

In this way, according to this embodiment, in manufacturing the semiconductor device 1, since the actual fixing step is performed after temporarily fixing the spherical semiconductors 11 by the instant adhesive agents 13, a shift in position does not occur between the two spherical semiconductors 11 even at the time of passing the spherical semiconductors 11 through the reflow oven or the like. Therefore, the spherical semiconductors 11, which are hard to handle because of their spherical shape, can be electrically and mechanically connected efficiently.

Figure 7:
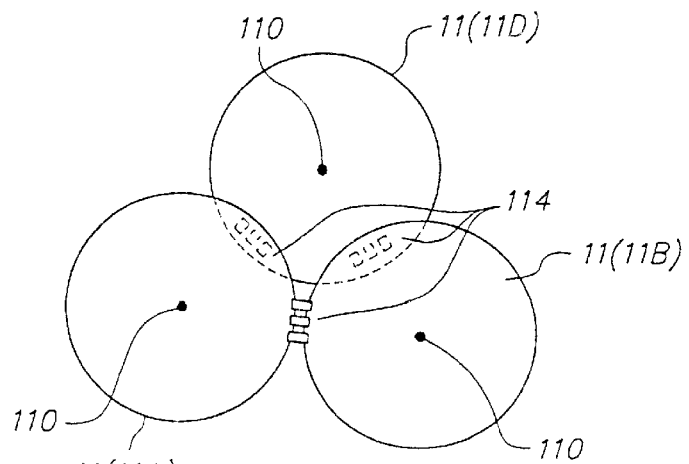
FIG. 7 illustrates the location of connecting members between adjacent spherical members of the present invention.

Preferably, adjacent spherical members are connected at a location proximately to a point of substantial contact between the two adjacent members. As shown in FIG. 7, for example, spherical member 11D on an upper stage is connected to each of spherical members 11A and 11B (and 11C, not shown) at a location that is proximate to a point of substantial contact between the member 11D and a respective lower member. Similarly, adjacent spherical members 11A and 11B on a lower level are connected to each other at a location proximate to a point of substantial contact. Adjacent spherical members are connected to each other by connecting members 114, which may be solder 12 and/or adhesive agents 13, for example.

In addition, in the semiconductor device 1 of this embodiment, the spherical semiconductor 11 is, for example, electrically connected to the substrate 15 as follows. FIG. 4 shows the process steps in a method for electrically and mechanically connecting a spherical semiconductor 11 to the substrate 15.

Figure 4A:
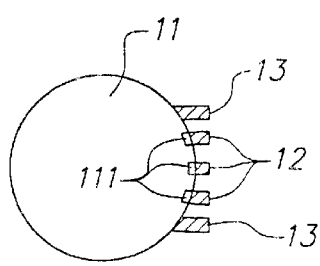
FIGS. 4(A) to 4(C) illustrate the process for electrically and mechanically connecting a spherical member to a substrate.

As shown in FIG. 4A, solder 12 (conductive material) is plated onto the surfaces of contact pads 111 of the spherical semiconductor 11. Next, instant adhesive agents 13 are applied at areas on the surface of the spherical semiconductor 11 slightly separated from the areas where the terminals 111 are formed.

Figure 4B:
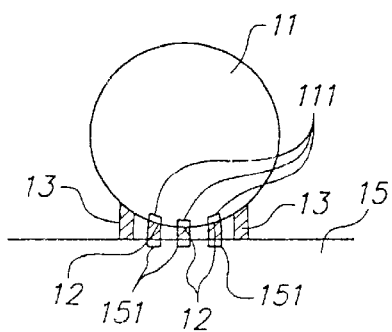

Next, as shown in FIG. 4B, the spherical semiconductor 11 onto which the solder 12 is plated and the instant adhesive agents 13 are applied is placed at a predetermined position on a substrate 15. In this case, the spherical semiconductor 11 is placed at a position where the solder 12 overlaps the terminals 151 formed on the substrate 15, and the spherical semiconductor 11 is temporarily fixed by the instant adhesive agents 13 to the substrate 15 (temporary fixing step).

Figure 4C:
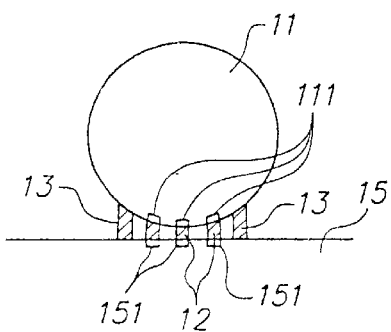
Figure 5:
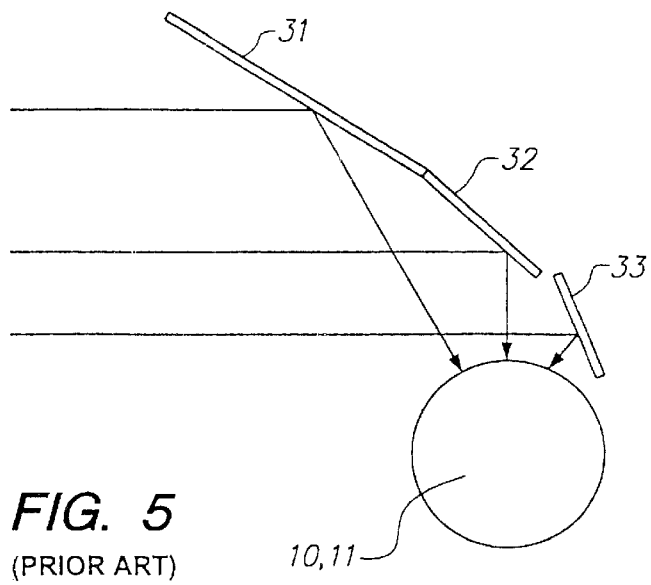
FIG. 5 illustrates an exposure method performed when manufacturing spherical semiconductor.
Figure 6:
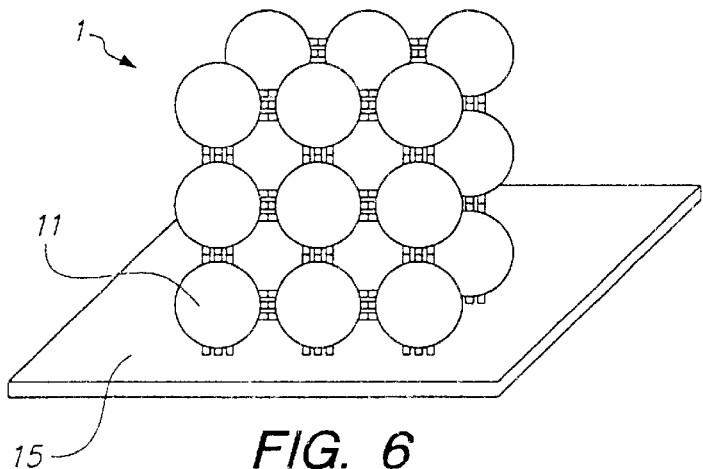
FIG. 6 illustrates a semiconductor device in which spherical semiconductors are stacked in multiple stages.

Next, the substrate 15, to which the spherical semiconductor 11 is temporarily fixed by the instant adhesive agents 13, is put in a reflow oven, and is heated to a temperature at which the solder 12 melts. Consequently, the solder 12 melts on the substrate 15. When taken out of the reflow oven, the spherical semiconductor 11 is completely fixed onto the substrate 15 by the solder 12, as shown in FIG. 4(C). That is, the spherical semiconductor 11 is electrically and mechanically connected to the substrate 15 by the solder 12 through one heating step (actual fixing step).

In this way, in manufacturing the semiconductor device 1, since the actual fixing step is performed after temporarily fixing the spherical semiconductor 11 to the substrate 15 by the instant adhesive agents 13, the spherical semiconductor 11 does not shift on the substrate 15 even at the time of passing the substrate 15 having the spherical semiconductor 11 mounted thereon through the reflow oven or the like. Therefore, the spherical semiconductor 11, which is hard to handle because of its spherical shape, can be electrically and mechanically connected efficiently.

(Other Embodiments)

While an example has been described in the above embodiment in which solder 12 is used as a conductive material, a conductive adhesive agent applied by an ink jet method or the like may be used as the conductive material. In addition, the conductive material may be formed on both terminals to be electrically and mechanically connected to each other, or on either one of the two terminals.

[Advantage]

As described above, according to the present invention, the spherical semiconductors stacked on the upper stage are positioned by the spherical semiconductors on the lower stage by, in contrast with the conventional technology, taking advantage of the fact that the spherical semiconductors are spherical in shape. That is, three spherical semiconductors of four semiconductors are arranged so as to be substantially in contact or nearly in contact with one another, and one spherical semiconductor is stacked in a depression which is formed in the center of these three spherical semiconductors. Therefore, a plurality of spherical semiconductors can be stacked at predetermined positions.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A semiconductor device comprising:

a plurality of spherical members stacked in multiple stages, at least one of said plurality of spherical members being formed of a semiconductor material and comprising at least one of a semiconductor element and wiring formed on a surface of said semiconductor material, said plurality of spherical members comprising at least one set of four spherical members arranged such that a regular triangular pyramid is formed by imaginary lines connecting the centers of said four spherical members, said four spherical members including three spherical members aligned so as to be substantially in contact with one another in a lower stage of said multiple stages and one spherical member stacked, in an upper stage of said multiple stages, on said three spherical members, wherein said plurality of spherical members includes a dummy spherical member that fills a gap formed between at least two other of said spherical members when said dummy spherical member and said at least two other spherical members are stacked in said multiple stages, said dummy spherical member being formed without a semiconductor element on its surface.

2. A semiconductor device of claim 1 wherein said plurality of spherical members comprises a plurality of sets of four spherical members such that a regular triangular pyramid is formed by imaginary lines connecting the centers of the four spherical members in each of said plurality of sets.

3. A semiconductor device of claim 1, wherein said plurality of spherical members includes at least one connecting spherical member that electrically connects to at least one other of said plurality of spherical members, said connecting spherical member being formed without a semiconductor element on its surface.

4. A semiconductor device of claim 1, wherein said dummy spherical member is formed of a non-conducting material.

5. A semiconductor device comprising:

at least one set of four spherical members stacked in multiple stages, each of said four spherical members being connected to each of the other four spherical members, at least one of said four spherical members being formed of a semiconductor material and comprising at least one of a semiconductor element and wiring formed on a surface of said semiconductor material, and one of said four spherical members being arranged on an upper stage of said multiple stages and being in contact with and supported by the other three of said spherical members arranged on a lower stage, wherein said four spherical members includes a dummy spherical member that fills a gap formed between at least two other of said four spherical members when said dummy spherical member and said at least two other spherical members are stacked in said multiple stages, said dummy spherical member being formed without a semiconductor element on its surface.

6. The semiconductor device of claim 5 further comprising a plurality of sets of four spherical members each.

7. The semiconductor device of claim 5 further comprising a substrate, wherein three spherical members of said at least one set are arranged on a lower stage mounted on said substrate.

8. The semiconductor device of claim 5 further comprising at least one connector for electrically connecting at least two spherical members of said at least one set to each other.

9. The semiconductor device of claim 8, wherein each of said at least two spherical members includes a contact pad that is connected to said at least one connector, and wiring connected to that contact pad.

10. The semiconductor device of claim 5 wherein each of said spherical members is substantially the same size and is substantially in contact with each other.

11. A semiconductor device comprising:

at least one set of four spherical members stacked in multiple stages, at least one of said plurality of spherical members being formed of a semiconductor material and comprising at least one of a semiconductor element and wiring formed on a surface of said semiconductor material, one spherical member of said at least one set arranged on an upper stage of said multiple stages and being in contact with and supported by the other three spherical members of said at least one set arranged on a lower stage, and at least one spherical member of said at least one set being a dummy spherical member that fills a gap formed between at least two other of said four spherical members when said dummy spherical member and said at least two other spherical members are stacked in said multiple stages, said dummy spherical member being formed without a semiconductor element on its surface.

12. The semiconductor device of claim 11 wherein said at least one spherical member formed without a semiconductor element on its surface comprises a connecting spherical member, said connecting spherical member comprising a wiring pattern for electrically connecting at least two other spherical members of said at least one set.

13. The semiconductor device of claim 11 wherein said at least one spherical member formed without a semiconductor element on its surface is formed of a spherically shaped semiconductor material.

14. The semiconductor device of claim 11 wherein said at least one spherical member formed without a semiconductor element on its surface is formed of a spherically shaped non-conducting material.

15. The semiconductor device of claim 11 comprising a plurality of sets of four spherical members each.

16. The semiconductor device of claim 11 further comprising a substrate, wherein three spherical members of said at least one set are arranged on a lower stage mounted on said substrate.

17. The semiconductor device of claim 11 further comprising at least one connector for electrically connecting at least two spherical members of said at least one set to each other.

18. The semiconductor device of claim 17 wherein each of said spherical members is substantially the same size and is substantially in contact with each other.

19. The semiconductor device of claim 11 wherein each of said spherical members is substantially the same size and is substantially in contact with each other.

20. The semiconductor device of claim 19 comprising at least one connecting member between adjacent spherical members that connects said adjacent spherical members at a location proximate to a point of substantial contact between said adjacent spherical members.

* * * * *

UNITED STATES PATENT AND TRADEMARK OFFICE
CERTIFICATE OF CORRECTION

PATENT NO.    : 6,476,461 B2
DATED         : November 5, 2002
INVENTOR(S)   : Kenji Uchiyama It is certified that error appears in the above-identified patent and that said Letters Patent is hereby corrected as shown below:

Column 8,
Line 5, please change "sa id" to -- said --.

Signed and Sealed this

Eleventh Day of March, 2003

JAMES E. ROGAN
*Director of the United States Patent and Trademark Office*